United States Patent
Mahran et al.

(10) Patent No.: US 9,939,855 B2
(45) Date of Patent: Apr. 10, 2018

(54) EXTENDED CAPACITY MEMORY SYSTEM WITH LOAD RELIEVED MEMORY AND METHOD OF MANUFACTURE THEREOF

(71) Applicant: SMART Modular Technologies, Inc., Newark, CA (US)

(72) Inventors: Victor Mahran, Ladera Ranch, CA (US); Robert S. Pauley, Jr., Mission Viejo, CA (US)

(73) Assignee: SMART Modular Technologies, Inc., Newark, CA (US)

( * ) Notice: Subject to any disclaimer, the term of this patent is extended or adjusted under 35 U.S.C. 154(b) by 147 days.

(21) Appl. No.: 14/942,787

(22) Filed: Nov. 16, 2015

(65) Prior Publication Data

US 2016/0070316 A1 Mar. 10, 2016

Related U.S. Application Data

(63) Continuation of application No. 13/633,074, filed on Oct. 1, 2012, now Pat. No. 9,204,550.

(Continued)

(51) Int. Cl.
*G06F 1/18* (2006.01)
*H05K 7/14* (2006.01)
(Continued)

(52) U.S. Cl.
CPC ............... *G06F 1/185* (2013.01); *G06F 1/20* (2013.01); *G11C 5/025* (2013.01); *H05K 1/144* (2013.01); *H05K 1/145* (2013.01); *H05K 7/1431* (2013.01); *H05K 1/0209* (2013.01); *H05K 2201/042* (2013.01); *H05K 2201/10159* (2013.01); *H05K 2201/10303* (2013.01); *H05K 2201/10378* (2013.01); *H05K 2201/10409* (2013.01); *Y10T 29/4913* (2015.01)

(58) Field of Classification Search
CPC ........... G06F 1/185; G06F 1/20; G11C 5/025; H05K 7/1431; H05K 1/0209; H05K 1/144; H05K 1/145; H05K 2201/042; H05K 2201/10159; H05K 2201/10303; H05K 2201/10378; H05K 2201/10409; Y10T 29/4913
USPC .......... 361/679.32, 679.54, 728–804; 29/825
See application file for complete search history.

(56) References Cited

U.S. PATENT DOCUMENTS 8,503,211 B2 8/2013 Gillingham et al.
9,204,550 B2 12/2015 Mahran et al.
(Continued)

OTHER PUBLICATIONS

United States Patent and Trademark Office, U.S. Appl. No. 13/633,074, Non-Final Office Action dated Jan. 20, 2015.

*Primary Examiner* — Dimary Lopez Cruz
*Assistant Examiner* — Zhengfu Feng
(74) *Attorney, Agent, or Firm* — Wong & Rees LLP

(57) ABSTRACT

A method of manufacture of an enhanced capacity memory system includes: providing a dual in-line memory module carrier having a memory module and an integrated memory buffer coupled to the memory module; coupling a memory expansion board, having a supplementary memory module, to the dual in-line memory module carrier including attaching a bridge transposer; and providing a system interface connector coupled to the integrated memory buffer and the bridge transposer for controlling the memory module, the supplementary memory module, or a combination thereof.

20 Claims, 8 Drawing Sheets

Related U.S. Application Data

(60) Provisional application No. 61/541,799, filed on Sep. 30, 2011.

(51) Int. Cl.
*H05K 1/14* (2006.01)
*G06F 1/20* (2006.01)
*G11C 5/02* (2006.01)
*H05K 1/02* (2006.01)

(56) References Cited

U.S. PATENT DOCUMENTS

| | | |
|---|---|---|
| 2003/0068920 A1 | 4/2003 | Li et al. |
| 2006/0034061 A1* | 2/2006 | Grundy ............... H01R 12/7082 361/785 |
| 2007/0126125 A1 | 6/2007 | Rapport et al. |
| 2008/0225476 A1* | 9/2008 | Karabatsos ............... G06F 1/185 361/679.32 |
| 2009/0279243 A1* | 11/2009 | Amidi ....................... G11C 5/04 361/679.31 |
| 2011/0069456 A1 | 3/2011 | Brandon et al. |
| 2013/0083473 A1 | 4/2013 | Mahran et al. |

\* cited by examiner

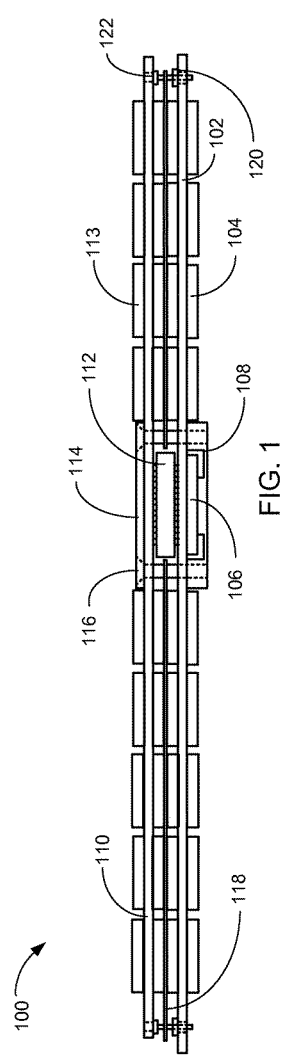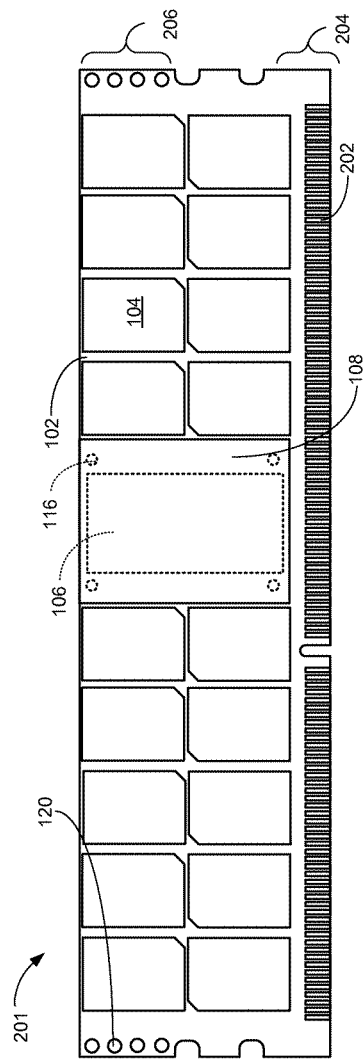
FIG. 1
FIG. 2

EXTENDED CAPACITY MEMORY SYSTEM WITH LOAD RELIEVED MEMORY AND METHOD OF MANUFACTURE THEREOF

CROSS-REFERENCE TO RELATED APPLICATION(S)

This is a continuation of co-pending U.S. patent application Ser. No. 13/633,074 filed Oct. 1, 2012, now U.S. Pat. No. 9,204,550.

TECHNICAL FIELD

The present invention relates generally to a dual in-line memory module for computer applications, and more particularly to an extended capacity memory module system.

BACKGROUND ART

Contemporary high performance computing main memory systems are generally composed of one or more memory devices, such as dual in-line memory modules (DIMMs), which are connected to one or more memory controllers and/or processors. The DIMMs may be connected via one or more memory interface elements such as buffers, hubs, bus-to-bus translators. The memory devices are generally located in a memory subsystem and are often connected via a pluggable interconnection system by one or more connectors to a system board, such as a PC motherboard.

Overall computer system performance is affected by each of the key elements of the computer structure, including the performance/structure of the processor, any memory caches, the input/output (I/O) subsystem, the efficiency of the memory control functions, the performance of the main memory devices, any associated memory interface elements, and the type and structure of the memory interconnect interface. Technology limitations have imposed an 8 gigabyte system memory limitation on most computer system architectures. The effects of capacitance, inductive loading, and interconnect delay limit the frequencies that memory systems can attain.

Other customer requirements further exacerbate the memory system design challenges, and include such items as ease of upgrade and reduced system environmental impact (such as space, power, and cooling). In addition, customers require the ability to access an increasing number of higher density memory devices (e.g. DDR3 and DDR4 DRAMs) at faster and faster access speeds.

Thus, a need still remains for an extended capacity memory system. In view of the world-wide reliance on computer systems, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an enhanced capacity memory system including: providing a dual in-line memory module carrier having a memory module and an integrated memory buffer coupled to the memory module; coupling a memory expansion board, having a supplementary memory module, to the dual in-line memory module carrier including attaching a bridge transposer; and providing a system interface connector coupled to the integrated memory buffer and the bridge transposer for controlling the memory module, the supplementary memory module, or a combination thereof.

The present invention provides an enhanced capacity memory system, including: a dual in-line memory module carrier having a memory module and an integrated memory buffer coupled to the memory module; an memory expansion board, having a supplementary memory module, coupled to the dual in-line memory module carrier by a bridge transposer; and a system interface connector coupled to the integrated memory buffer and the bridge transposer for controlling the memory module, the supplementary memory module, or a combination thereof.

Certain embodiments of the invention have other steps or elements in addition to or in place of those mentioned above. The steps or elements will become apparent to those skilled in the art from a reading of the following detailed description when taken with reference to the accompanying drawings.

BRIEF DESCRIPTION OF THE DRAWINGS

FIG. 1 is a top plan view of an enhanced capacity memory system in an embodiment of the present invention.

FIG. 2 is a front plan view of an enhanced capacity memory system.

BEST MODE FOR CARRYING OUT THE INVENTION

Figure 3:
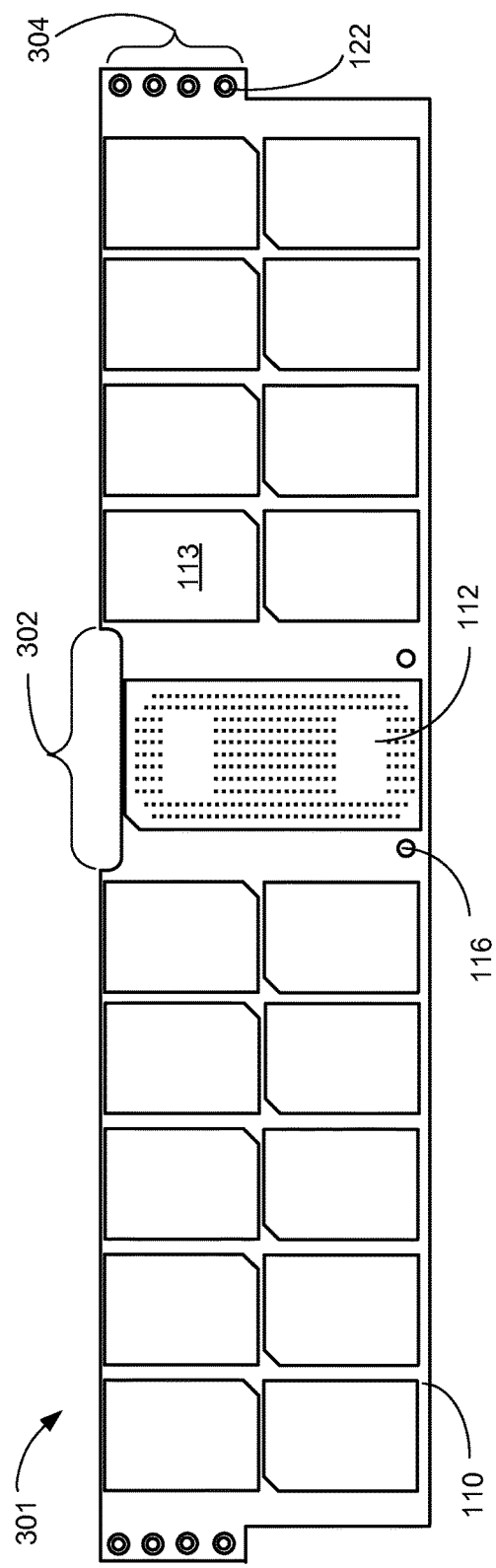
FIG. 3 is a front view of a memory expansion module of the enhanced capacity memory system of FIG. 1.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals.

For expository purposes, the term "horizontal" as used herein is defined as a plane parallel to the surface of the socket side of a system board, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means there is direct contact between elements with no intervening material.

The term "processing" as used herein includes deposition of material or photoresist, patterning, exposure, development, etching, cleaning, and/or removal of the material or photoresist as required in forming a described structure. The term "boss" as used herein means a reinforcing structure surrounding a single opening used for mounting or attachment of a device.

Referring now to FIG. 1, therein is shown a top plan view of an enhanced capacity memory system 100 in an embodiment of the present invention. The top plan view of the enhanced capacity memory system 100 depicts a dual in-line memory module (DIMM) carrier 102 having memory modules 104 distributed on the front and the back of the dual in-line memory module (DIMM) carrier 102.

An integrated memory buffer module 106 is centrally located in the front side of the dual in-line memory module (DIMM) carrier 102. The integrated memory buffer module 106 provides control of address and data between the memory modules 104 and the next level system (not shown). A core heat sink 108 can be mounted directly on the integrated memory buffer module 106. The core heat sink 108 can be formed of a highly conductive thermal material or combination of materials. The core heat sink 108 can extend over the memory modules 104. For example, the core heat sink 108 can include flanges (not shown) extending from one end to another end of the core heat sink 108 and covering all the memory modules 104 to provide heat conduction from the memory modules 104.

A memory expansion board 110 can be coupled to the integrated memory buffer module 106 by a bridge transposer 112 positioned between the memory expansion board 110 and the dual in-line memory module (DIMM) carrier 102. The memory expansion board 110 can have the same number of supplementary memory modules 113 as the memory modules 104 mounted on dual in-line memory module (DIMM) carrier 102 thereby doubling the capacity.

The bridge transposer 112 can be manufactured by printed circuit board techniques as a laminate interposer or ceramic interposer. Conductive elements are formed through the bridge transposer 112. The conductive elements of the bridge transposer 112 can be positioned on conductive pads on both the memory expansion board 110 and the dual in-line memory module (DIMM) carrier 102.

The bridge transposer 112 can provide a balanced transmission line between the integrated memory buffer module 106 and the supplementary memory modules 113 mounted on the memory expansion board 110. By managing the memory modules 104, on the dual in-line memory module (DIMM) carrier 102, and the supplementary memory modules 113, on the memory expansion board 110, with a single instance of the integrated memory buffer module 106 address and data contention problems are prevented and twice the memory capacity can be provided through the single instance of the integrated memory buffer module 106.

The memory expansion board 110 is held in place by a heat spreader plate 114 that is secured to the core heat sink 108 by mounting screws 116 positioned adjacent the bridge transposer 112 and near the corners of the heat spreader plate 114 and the core heat sink 108. A heat spreader sheet 118, coupled to the mounting screws 116, can be in contact with the memory modules 104 that are mounted between the memory expansion board 110 and the dual in-line memory module (DIMM) carrier 102.

The extremities of the memory expansion board 110 and the dual in-line memory module (DIMM) carrier 102 are coupled by a micro jack 120 mounted in the dual in-line memory module (DIMM) carrier 102 and a micro pin 122 mounted in the memory expansion board 110. The micro pin 122 extends through the heat spreader sheet 118 and into the micro jack 120. This coupling can provide mechanical stability as well as electrical and thermal continuity between the memory expansion board 110 and the dual in-line memory module (DIMM) carrier 102.

It has been discovered that the mounting of the memory expansion board 110 to the dual in-line memory module (DIMM) carrier 102 through the bridge transposer 112 can provide twice the capacity of the memory modules 104 while saving up to 40% of the power consumed by standard DIMM modules of equal capacity. The use of the heat spreader plate 114, the core heat sink 108, the heat spreader sheet 118, the micro jack 120, and the micro pin 122 can provide thermal relief for the memory modules 104 and the supplementary memory modules 113 mounted between the memory expansion board 110 and the dual in-line memory module (DIMM) carrier 102.

Referring now to FIG. 2, therein is shown a front plan view of an enhanced capacity memory system 201. The front plan view of the enhanced capacity memory system 201 includes the dual in-line memory module (DIMM) carrier 102 having the memory modules 104 mounted thereon.

The dual in-line memory module (DIMM) carrier 102 has a series of connector fingers 202 that form a system interface connector 204. A corner connector 206 comprised of a plurality of the micro jack 120 can be positioned in the top corners at opposite ends of the dual in-line memory module (DIMM) carrier 102.

It is understood that the dual in-line memory module (DIMM) carrier 102 includes a redistribution layer not shown that can couple the integrated memory buffer module 106 to the memory modules 104 and the system interface connector 204. Also, signal conditioning components are not shown, but can be present between the instances of the memory modules 104. The signal conditioning components can include resistors and capacitors.

The core heat sink 108 can be mounted on the integrated memory buffer module 106 and held in position by the mounting screws 116 adjacent to the corners of the integrated memory buffer module 106. The thermal interface between the integrated memory buffer module 106 and the core heat sink 108 can relieve the thermal stress associated with driving the additional transmission lines of the bridge transposer 112 of FIG. 1 and the memory modules 104 of the memory expansion board 110 of FIG. 1.

Referring now to FIG. 3, therein is shown a front view of a memory expansion module 301 of the enhanced capacity memory system 100 of FIG. 1. The front view of the memory expansion module 301 depicts the memory expansion board 110 having the bridge transposer 112 mounted in a center region. For illustrative purposes, the front view depicts the bridge transposer 112 mounted on a front side of the memory expansion board 110, although it is understood that the bridge transposer 112 can be mounted in a different manner. For example, the bridge transposer 112 can be mounted on a backside of the dual in-line memory module (DIMM) carrier 102.

The memory expansion board 110 can optionally include a saddle region 302 over the bridge transposer 112 to provide spacing for securing a heat sink clip (not shown) for mounting or attaching the core heat sink 108 of FIG. 1, the heat spreader plate 114 of FIG. 1, or a combination thereof. The saddle region 302 can coincide with the top edge of the bridge transposer 112. The core heat sink 108 can have a protruded surface that engages the saddle region 302 to provide additional mechanical stability to the memory expansion board 110.

The mechanical stability of the memory expansion board 110 can be enhanced by corner pins 304 formed by a plurality of the micro pin 122. The position of the corner pins 304 aligns with the corner connector 206 of FIG. 2. The mounting of the memory expansion module 301 on the enhanced capacity memory system 201 of FIG. 2 includes engaging the corner pins 304 with the corner connector 206.

It is understood that the memory expansion board 110 can include a redistribution layer not shown that can couple the integrated memory buffer module 106 of FIG. 1 to the supplementary memory modules 113 through the bridge transposer 112. The bottom edge of the memory expansion board 110 is adjacent to the bottom row of the supplementary memory modules 113 and the bridge transposer 112.

Figure 4:
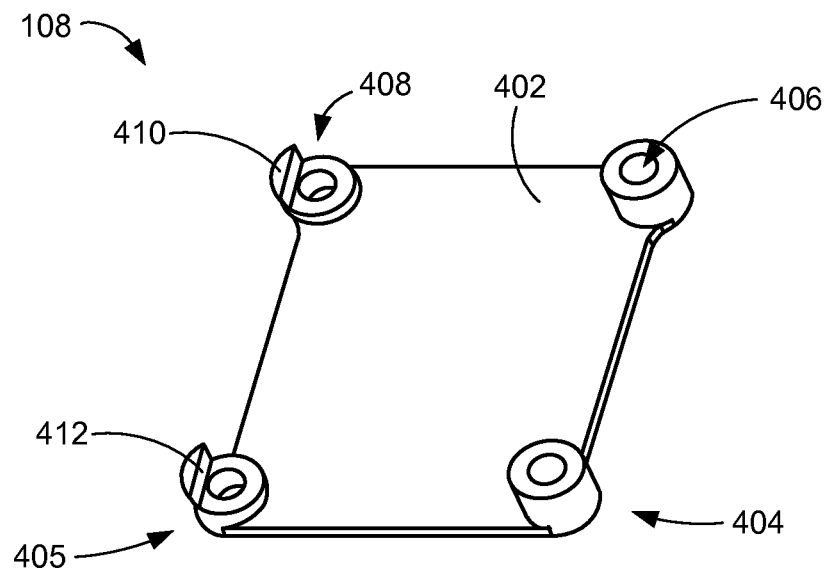
FIG. 4 is an exemplary isometric view of the core heat sink.

Referring now to FIG. 4, therein is shown an exemplary isometric view of the core heat sink 108. The exemplary isometric view depicts an inner surface 402 of the core heat sink 108. The core heat sink 108 can be mounted such that the inner surface 402 faces the integrated memory buffer module 106 of FIG. 1. The core heat sink 108 can be mounted with a thermal interface material (not shown) between and in contact with the inner surface 402 and the integrated memory buffer module 106. The core heat sink 108 can include the flanges (not shown) over the memory modules 104 of FIG. 1 with the thermal interface material between and in contact with the inner surface 402 and the memory modules 104.

The core heat sink 108 can include a first mounting boss 404 and a second mounting boss 405 positioned in corners of the core heat sink 108. The first mounting boss 404 and the second mounting boss 405 can protrude from the inner surface 402. The first mounting boss 404 and the second mounting boss 405 can be formed of the same material as the inner surface 402. The first mounting boss 404 and the second mounting boss 405 can include mounting holes 406 for receiving the mounting screws 116 of FIG. 1 to secure the core heat sink 108 to the heat spreader plate 114 of FIG. 1. For example, the mounting holes 406 can be threaded.

The second mounting boss 405 can include a recess portion 408 and an alignment ridge 410 extending above the recess portion 408. The alignment ridge 410 is used to align the core heat sink 108 when mounting the core heat sink 108 over the integrated memory buffer module 106 and the memory modules 104 with a ridge non-horizontal side 412 of the alignment ridge 410 facing a non-horizontal side of the integrated memory buffer module 106.

For example, the first mounting boss 404 and the second mounting boss 405 can have the same height such that a top side of the first mounting boss 404 is coplanar with a top side of the alignment ridge 410. Also for example, a top side of the first mounting boss 404 can be coplanar with a top side of the recess portion 408.

For example, a top side of the recess portion 408, a top side of the first mounting boss 404, or a combination thereof can be facing and mounted to the integrated memory buffer module 106. Also for example, the ridge non-horizontal side 412 and a non-horizontal side of the first mounting boss 404 can face non-horizontal sides of the integrated memory buffer module 106.

It has been discovered that the first mounting boss 404 and the second mounting boss 405 having the recess portion 408 the alignment ridge 410 provide improved reliability. The recess portion 408 the alignment ridge 410 along with the first mounting boss 404 opposite the second mounting boss 405 allow the core heat sink 108 to be securely mounted or attached to the integrated memory buffer module 106 resulting in the improved reliability.

Figure 5:
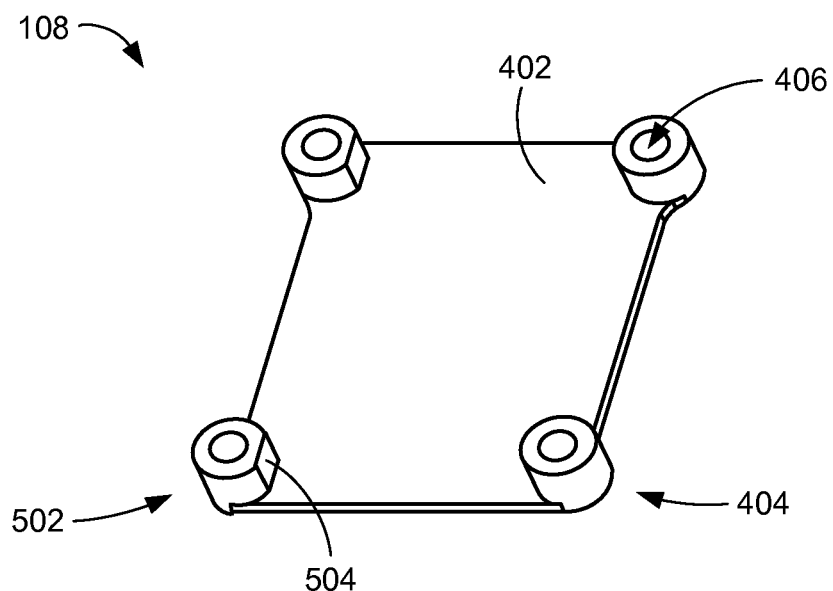
FIG. 5 is another exemplary isometric view of the core heat sink.

Referring now to FIG. 5, therein is shown another exemplary isometric view of the core heat sink 108. The another exemplary isometric view depicts the inner surface 402 of the core heat sink 108.

The core heat sink 108 can include the first mounting boss 404 and a third mounting boss 502 positioned in the corners of the core heat sink 108. The first mounting boss 404 and the third mounting boss 502 can protrude from the inner surface 402. The first mounting boss 404 and the third mounting boss 502 can be formed of the same material as the inner surface 402. The first mounting boss 404 and the third mounting boss 502 can include the mounting holes 406 for receiving the mounting screws 116 of FIG. 1 to secure the core heat sink 108 to the heat spreader plate 114 of FIG. 1.

The third mounting boss 502 can include a flat non-horizontal side 504 for aligning the core heat sink 108 when mounting the core heat sink 108 over the integrated memory buffer module 106 of FIG. 1 and the memory modules 104 of FIG. 1. The flat non-horizontal side 504 can face a non-horizontal side of the integrated memory buffer module 106.

For example, the first mounting boss 404 and the third mounting boss 502 can have the same height such that a top side of the first mounting boss 404 is coplanar with a top side of the third mounting boss 502. Also for example, the flat non-horizontal side 504 and a non-horizontal side of the first mounting boss 404 can face non-horizontal sides of the integrated memory buffer module 106.

It has been discovered that the first mounting boss 404 and the third mounting boss 502 having the flat non-horizontal side 504 provide improved reliability. The flat non-horizontal side 504 and the first mounting boss 404 opposite the third mounting boss 502 allow the core heat sink 108 to be securely mounted or attached to the integrated memory buffer module 106 resulting in the improved reliability.

Figure 6:
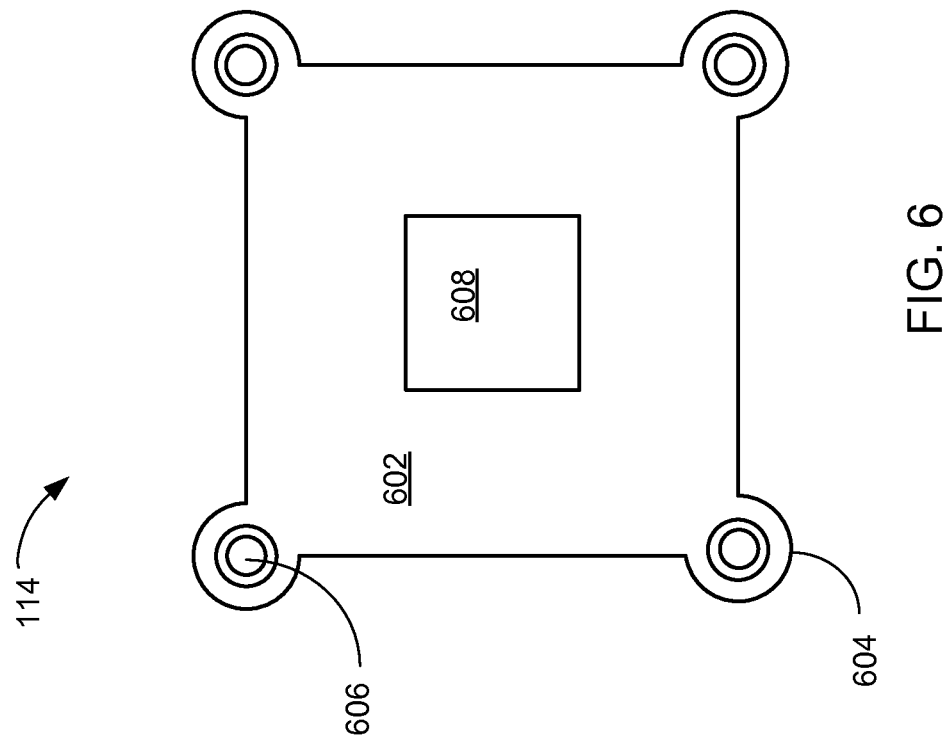
FIG. 6 is a back side view of the heat spreader plate of the present invention.

Referring now to FIG. 6, therein is shown a back side view of the heat spreader plate 114 of the present invention. The back side view of the heat spreader plate 114 depicts a back surface 602 having mounting tabs 604 positioned at the corners. Each of the mounting tabs 604 has a counter-sunk opening 606 formed to accept the mounting screws 116 of FIG. 1. The mounting screws 116 must fit flush with or below the back surface 602.

It is understood that the heat spreader plate 114 can be molded, stamped, machined, or a combination thereof. It is further understood that the heat spreader plate 114 can be of the same material or combination of materials as the core heat sink 108 of FIG. 1. It is further understood that the heat spreader plate 114 can include a process opening 608 located near the center of the back surface 602.

Figure 7:
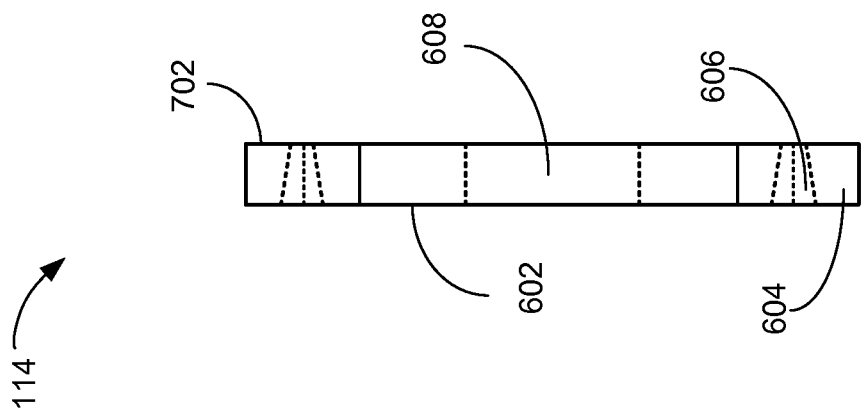
FIG. 7 is a side plan view of the heat spreader plate of the present invention.

Referring now to FIG. 7, therein is shown a side plan view of the heat spreader plate 114 of the present invention. The side plan view of the heat spreader plate 114 depicts the back surface 602 having the mounting tabs 604 positioned around the counter-sunk opening 606. The process opening 608 can pass from the back surface 602 to an expansion board support surface 702. The expansion board support surface 702 can provide mounting pressure and a thermal relief path for the memory expansion board 110 of FIG. 1.

Figure 8:
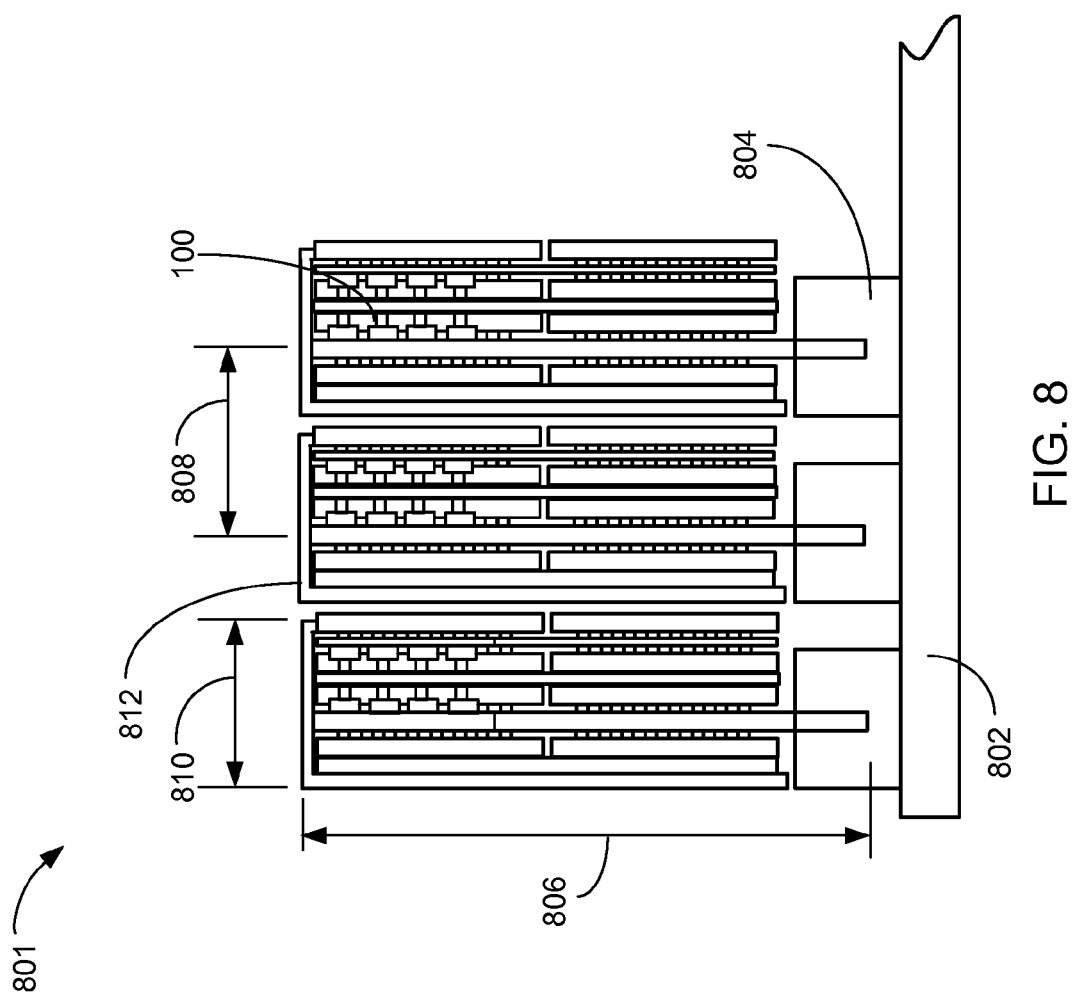
FIG. 8 is a side view of an application of the enhanced capacity memory system of FIG. 1.

Referring now to FIG. 8, therein is shown a side view of an application 801 of the enhanced capacity memory system 100 of FIG. 1. The side view of the application 801 depicts a segment of a system board 802 having a group of dual in-line memory module (DIMM) sockets 804.

The position and spacing of the dual in-line memory module (DIMM) sockets 804 is set to standard spacing as defined by the joint electronic devices engineering council (JEDEC) standards of the memory technology to be installed. The JEDEC standards specify maximum package height and connector spacing for commercial computer applications.

A unit height 806 and a unit spacing 808 of the application 801 of the enhanced capacity memory system 100 meets all of the mechanical and electrical specifications for the JEDEC standard for DDR-3 memory modules. The application 801 has the unit height 806 that meets the JEDEC maximum height of 30.25 mm.

The enhanced capacity memory system 100 can include the core heat sink 108 of FIG. 1 mounted in any manner. For example, the core heat sink 108 can be mounted by the mounting screws 116 of FIG. 1 to secure the core heat sink 108 and the heat spreader plate 114 of FIG. 1. Also for example, the core heat sink 108 can include the heat sink clip mounted over the top of the dual in-line memory module (DIMM) carrier 102, the memory expansion board 110, or a combination thereof.

It has been discovered that the enhanced capacity memory system 100 can provide twice the memory capacity within the operational envelope of the unit spacing 808 as defined by the JEDEC DDR-3 specification without deviation. The unit spacing 808 of 10.16 mm defines the envelope that any memory package must fit within. The application 801 can have a maximum of a package thickness 810 of 9.0 mm. The application 801 as measured includes an external heat sink 812 for operation in adverse temperature environments.

Figure 9:
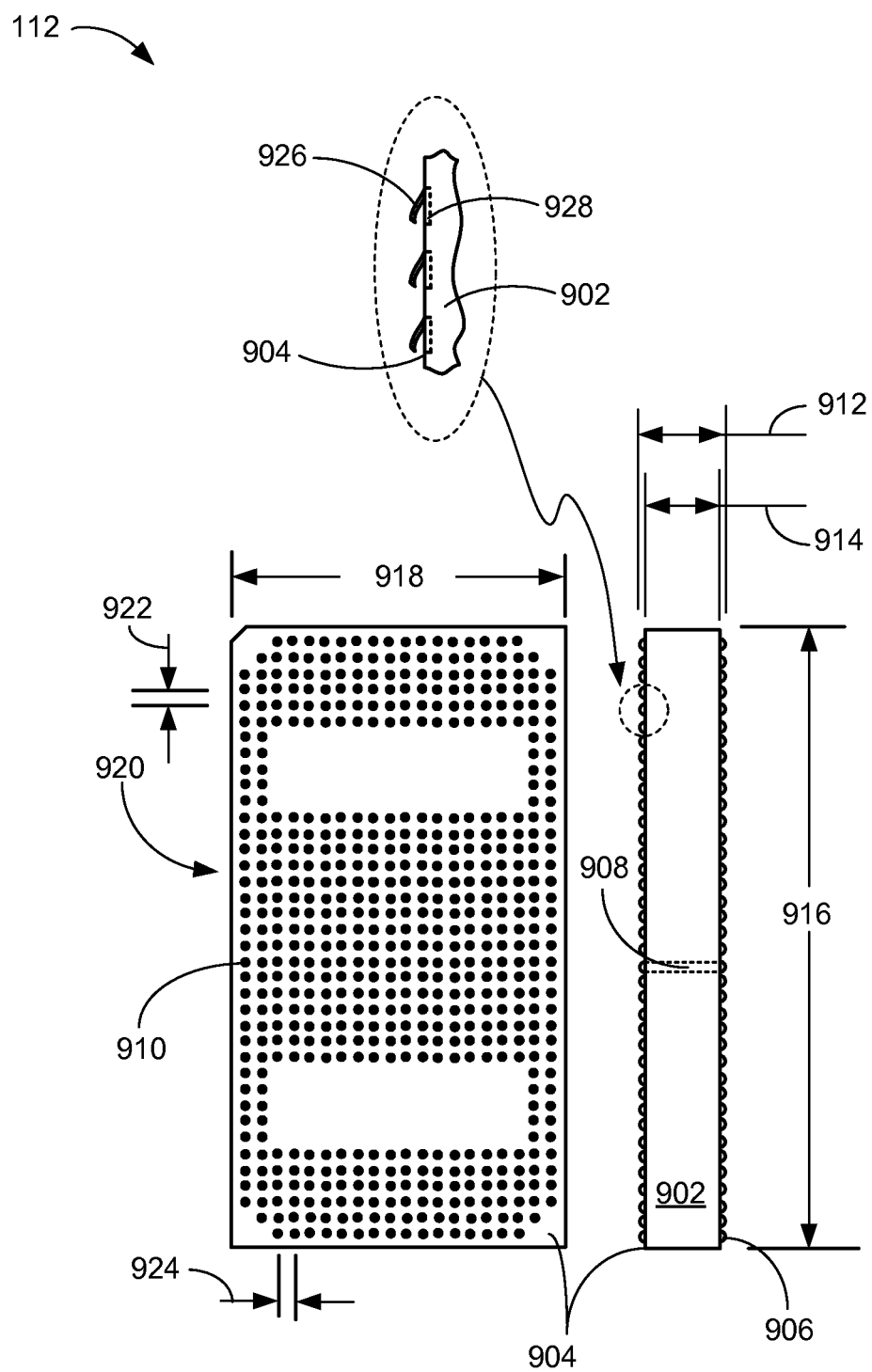
FIG. 9 is a perspective drawing of the bridge transposer of the present invention.

Referring now to FIG. 9, therein is shown a perspective drawing of the bridge transposer 112 of the present invention. The perspective drawing of the bridge transposer 112 depicts an interposer substrate 902 having a front side 904 and a back side 906. Through substrate conductors 908 pass directly through the interposer substrate 902 and terminate with contacts 910 on both the front side 904 and the back side 906. It is understood that the through substrate conductors 908 is shown with hidden lines because they are internal to the interposer substrate 902. While only one of the through substrate conductors 908 is shown, it is understood that each of the contacts 910 is coupled from the front side 904 to the back side 906 by one of the through substrate conductors 908 on a one-to-one basis.

In order to meet critical package dimensions of the application 801 of FIG. 8 a through substrate contact spacing 912 can be a nominal value of 3.5 mm, while a substrate thickness 914 has the nominal value of 3.0 mm between the front side 904 and the back side 906. A vertical height 916, of the interposer substrate 902, has the nominal value of 25.25 mm. A horizontal width 918 of the interposer substrate 902 can have the nominal value of 13.50 mm. An array 920 of the contacts 910 can have a vertical spacing 922 with the nominal value of 0.65 mm and a horizontal spacing 924 with the nominal value of 0.65 mm.

It has been discovered that the bridge transposer 112 of the present invention can be manufactured with exacting measurements through standard substrate processes and can utilize FR-4 printed circuit board material, flex circuit material, or ceramic material with acceptable manufacturing yield. The proximity and arrangement of the conductors 910 can for transmission line effects between signal and ground reference instances of the conductors 910.

For illustrative purposes, the bridge transposer 112 is shown with the contacts 910, although it is understood that the bridge transposer 112 can include any electrical connectors. For example, the bridge transposer 112 can include contact fingers 926 on the front side 904, as shown by a dash circle. Also for example, the bridge transposer 112 can include the contacts 910, the contact fingers 926, or a combination thereof on the front side 904, the back side 906, or a combination thereof. Further, for example, the contact fingers 926 can represent electrical connectors including metal spring contacts and spring pins.

The front side 904 can have contact openings 928, for extending the contact fingers 926, across the front side 904. The contact fingers 926 can function as an electrical or thermal interface through direct contact on the dual in-line memory module carrier 102 of FIG. 1 or the memory expansion board 110 of FIG. 1. The contact fingers 926 can be formed with an electrically conductive material including metal in order to provide electrical connectivity and thermal transfer while maintaining resilient contact force on the surface of the dual in-line memory module carrier 102 or the memory expansion board 110.

The scale or dimension of the contact fingers 926 may not be the same as the contacts 910. For example, lengths of the contact fingers 926 can be greater than lengths or diameters of the contacts 910. Also for example, widths of the contact fingers 926 can be less than widths or diameters of the contacts 910.

It has been discovered that the contact fingers 926 provides improved reliability for electrical connection between the bridge transposer 112 and the dual in-line memory module carrier 102 or the memory expansion board 110. The resilient force applied by the contact fingers 926 provides a robust connection providing improved signal integrity resulting in the improved reliability.

Figure 10:
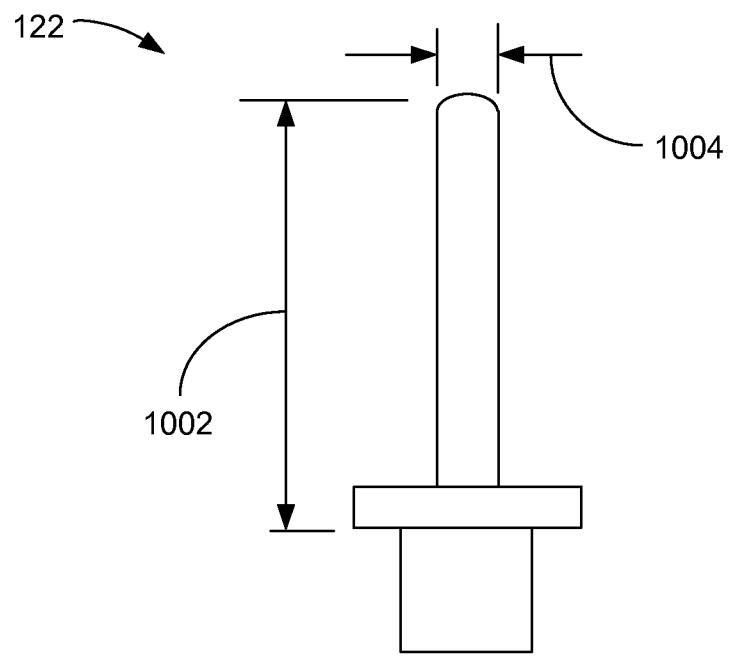
FIG. 10 is a side view of the micro pin of the present invention.

Referring now to FIG. 10, therein is shown a side view of the micro pin 122 of the present invention. The side view of the micro pin 122 depicts a penetration length 1002 of 5.10 mm and a shaft diameter 1004 of 0.64 mm.

The micro pin 122 can be mounted in the memory expansion board 110 of FIG. 1 in order to provide an anchor for the heat spreader sheet 118, as well as thermal, electrical, and mechanical stability for attaching the memory expansion board 110 to the dual in-line memory module (DIMM)

carrier 102. The micro pin 122 can be used for coupling a ground reference or source voltage in making the connection.

Figure 11:
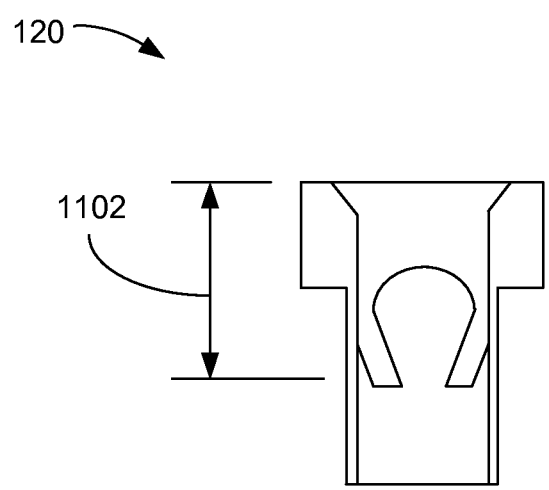
FIG. 11 is a side view of the micro jack of the present invention.

Referring now to FIG. 11, therein is shown a side view of the micro jack 120 of the present invention. The side view of the micro jack 120 depicts an entry capture depth 1102 of 2.11 mm. The entry capture depth 1102 represents the amount of the penetration length 1002 of FIG. 10 required to make a secure connection between the micro pin 122 of FIG. 1 and the micro jack 120.

Figure 12:
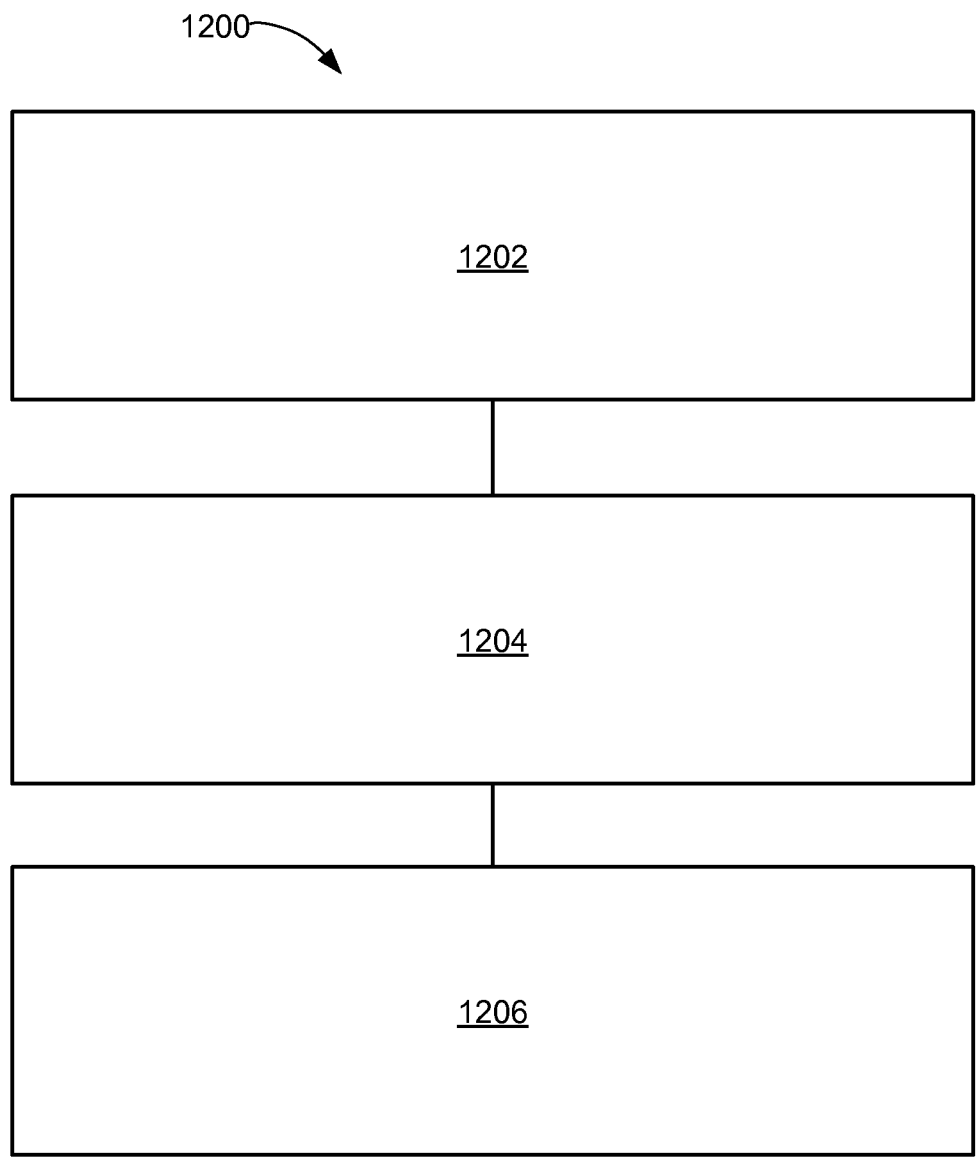
FIG. 12 is a flow chart of a method of manufacture of the enhanced capacity memory system in a further embodiment of the present invention.

Referring now to FIG. 12, therein is shown a flow chart of a method 1200 of manufacture of the enhanced capacity memory system 100 in a further embodiment of the present invention. The method 1200 includes: providing a dual in-line memory module carrier having a memory module and an integrated memory buffer coupled to the memory module in a block 1202; coupling a memory expansion board, having a supplementary memory module, to the dual in-line memory module carrier including attaching a bridge transposer in a block 1204; and providing a system interface connector coupled to the integrated memory buffer and the bridge transposer for controlling the memory module, the supplementary memory module, or a combination thereof in a block 1206.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing double density memory systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an enhanced capacity memory system comprising:
    coupling a memory expansion board, having a supplementary memory module, to a dual in-line memory module carrier including attaching a bridge transposer, the dual in-line memory module carrier having a memory module and an integrated memory buffer coupled to the memory module, the memory expansion board held in place by mounting screws adjacent the bridge transposer and the integrated memory buffer, the bridge transposer attached directly to the memory expansion board and the dual in-line memory module carrier for installing the enhanced capacity memory system into a single dual in-line memory module socket.

2. The method as claimed in claim 1 further comprising mounting a heat spreader sheet between the memory module and the supplementary memory module.

3. The method as claimed in claim 1 further comprising:
    mounting a micro jack in a corner of the dual in-line memory module carrier; and
    mounting a micro pin in the corner of the memory expansion board including engaging the micro pin in the micro jack.

4. The method as claimed in claim 1 wherein attaching the bridge transposer includes:
    coupling a contact on a back side to the memory expansion board; and
    coupling a through substrate conductor to the dual in-line memory module carrier through the contact on a front side.

5. A method of manufacture of an enhanced capacity memory system comprising:
    assembling a dual in-line memory module carrier by:
        attaching a memory module to the dual in-line memory module carrier, and
        mounting an integrated memory buffer, on the dual in-line memory module carrier, coupled to the memory module; and
    coupling a memory expansion board to the dual in-line memory module carrier including:
        attaching a bridge transposer directly to the dual in-line memory module carrier and the memory expansion board for installing the enhanced capacity memory system into a single dual in-line memory module socket, and
        coupling a supplementary memory module, on the memory expansion board, to the integrated memory buffer through the bridge transposer, the memory expansion board held in place by mounting screws adjacent the bridge transposer and the integrated memory buffer.

6. The method as claimed in claim 5 further comprising mounting a heat spreader sheet between the memory module on the dual in-line memory module carrier and the supplementary memory module on the memory expansion board.

7. The method as claimed in claim 5 further comprising:
    mounting a micro jack in a corner of the dual in-line memory module carrier;
    clamping a heat spreader sheet between the dual in-line memory module carrier and the memory expansion board; and
    mounting a micro pin in the corner of the memory expansion board including engaging the micro pin through the heat spreader sheet and in the micro jack.

8. The method as claimed in claim 5 wherein attaching the bridge transposer includes:
    coupling a contact on a back side of an interposer substrate to the memory expansion board; and
    coupling a through substrate conductor to the dual in-line memory module carrier through the contact on a front side including coupling the integrated memory buffer to the memory expansion board.

9. An enhanced capacity memory system comprising:
    a dual in-line memory module carrier having a memory module and an integrated memory buffer coupled to the memory module;
    a memory expansion board, having a supplementary memory module, coupled to the dual in-line memory module carrier;
    a bridge transposer attached directly to the memory expansion board and the dual in-line memory module carrier for installing the enhanced capacity memory system into a single dual in-line memory module socket; and mounting screws adjacent the bridge transposer and the integrated memory buffer that hold the memory expansion board in place.

10. The system as claimed in claim 9 further comprising a heat spreader sheet mounted on the memory module and the supplementary memory module.

11. The system as claimed in claim 9 further comprising:
a micro jack mounted in a corner of the dual in-line memory module carrier; and
a micro pin mounted in the corner of the memory expansion board includes the micro pin engaged in the micro jack.

12. The system as claimed in claim 9 wherein the bridge transposer includes:
a contact on a back side coupled to the memory expansion board; and
a through substrate conductor coupled to the dual in-line memory module carrier through the contact on a front side.

13. The system as claimed in claim 9 further comprising a heat spreader sheet on the memory module and the supplementary memory module includes the heat spreader sheet, the memory module and the supplementary memory module between the dual in-line memory module carrier and the memory expansion board.

14. The system as claimed in claim 13 wherein:
the memory expansion board coupled to the dual in-line memory module carrier includes:
a core heat sink on the integrated memory buffer and the dual in-line memory module carrier, and
a heat spreader plate on the memory expansion board; and
the mounting screws are near the core heat sink and the heat spreader plate and coupled to the heat spreader sheet.

15. The system as claimed in claim 13 further comprising a plurality of memory modules on the dual in-line memory module carrier and a same plurality of supplementary memory modules on the memory expansion board, the enhanced capacity memory system having a double capacity with the plurality of the memory modules and the same plurality of the supplementary memory modules.

16. The system as claimed in claim 13 further comprising:
a micro jack mounted in a corner of the dual in-line memory module carrier; and
a micro pin mounted in the corner of the memory expansion board includes the micro pin through the heat spreader sheet and engaged in the micro jack.

17. The system as claimed in claim 13 wherein the bridge transposer includes:
a contact on a back side coupled to the memory expansion board; and
a through substrate conductor coupled to the dual in-line memory module carrier through the contact on a front side includes the integrated memory buffer coupled to the memory expansion board.

18. The method as claimed in claim 1 wherein attaching the bridge transposer includes attaching a contact finger of the bridge transposer on the dual in-line memory module carrier.

19. The method as claimed in claim 5 wherein attaching the bridge transposer includes attaching a contact finger of the bridge transposer directly on the dual in-line memory module carrier.

20. The system as claimed in claim 9 wherein the bridge transposer includes a contact finger on the dual in-line memory module carrier.

* * * * *